United States Patent

Strayer, Jr.

[11] 4,118,668
[45] Oct. 3, 1978

[54] R.F. NETWORK ANTENNA ANALYZER EMPLOYING SAMPLING TECHNIQUES AND HAVING REMOTELY LOCATED SAMPLING PROBES

[75] Inventor: Roy E. Strayer, Jr., Manassas Park, Va.

[73] Assignee: The United States of America as represented by the Secretary of the Army, Washington, D.C.

[21] Appl. No.: 832,494

[22] Filed: Sep. 12, 1977

[51] Int. Cl.² .................................. H04B 17/00
[52] U.S. Cl. ............................. 325/67; 343/703; 324/96
[58] Field of Search ............ 343/703, 894; 324/96; 325/67

[56] References Cited

U.S. PATENT DOCUMENTS 4,004,227  1/1977  Ikrath ............................ 343/703

*Primary Examiner*—Eli Lieberman
*Attorney, Agent, or Firm*—Nathan Edelberg; Robert B. Gibson; Saul Elbaum

[57] ABSTRACT

The present invention relates to the combination of two conventional vector voltmeters into a single network analyzer for an antenna. The first vector voltmeter is connected to the output of an antenna being tested while a second voltmeter is connected to the output of the reference antenna. Signals from these antennas may be fed over long transmission lines to a central unit which permits subsequent signal processing to form data relating to signal amplitude from the antennas and phase relationship. The amplitude and phase data may be fed to the input of a digital computer for network analysis.

10 Claims, 4 Drawing Figures

R.F. NETWORK ANTENNA ANALYZER EMPLOYING SAMPLING TECHNIQUES AND HAVING REMOTELY LOCATED SAMPLING PROBES

RIGHTS OF THE GOVERNMENT

The invention described herein may be manufactured, used, and licensed by or for the United States Government for governmental purposes without the payment to me of any royalty thereon.

BRIEF DESCRIPTION OF THE PRIOR ART

Field testing of r.f. antennas is mandatory before they may be relied upon. In the case of military applications, high accuracy in the testing procedure is necessary. This requires that any antenna undergoing testing be placed in a vicinity where there are no structures which would produce signal reflections thereby distorting the results of a testing program. During the present time, antenna testing for military applications includes a field setup wherein data is gathered from an antenna undergoing testing and a reference antenna. After a certain amount of signal pre-processing, data is sent via a microwave link to a central station where network analysis is performed for the antenna undergoing testing. As will be appreciated, such a procedure is quite costly and there are periods when conditions prevent perfect microwave transmission as is required for the type of accuracy involved in antenna testing of the present type.

BRIEF DESCRIPTION OF THE PRESENT INVENTION

The present invention is related to a simplification of the hardware and procedure required for the testing of r.f. antennas, particularly for military applications. Use is made of conventional vector voltmeters with a minimum amount of reconnection. With the present invention, it is possible to achieve complete data processing of amplitude and phase relationships between a test antenna and a reference antenna, at a field site. This obviates the customary reliance upon extended microwave links.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
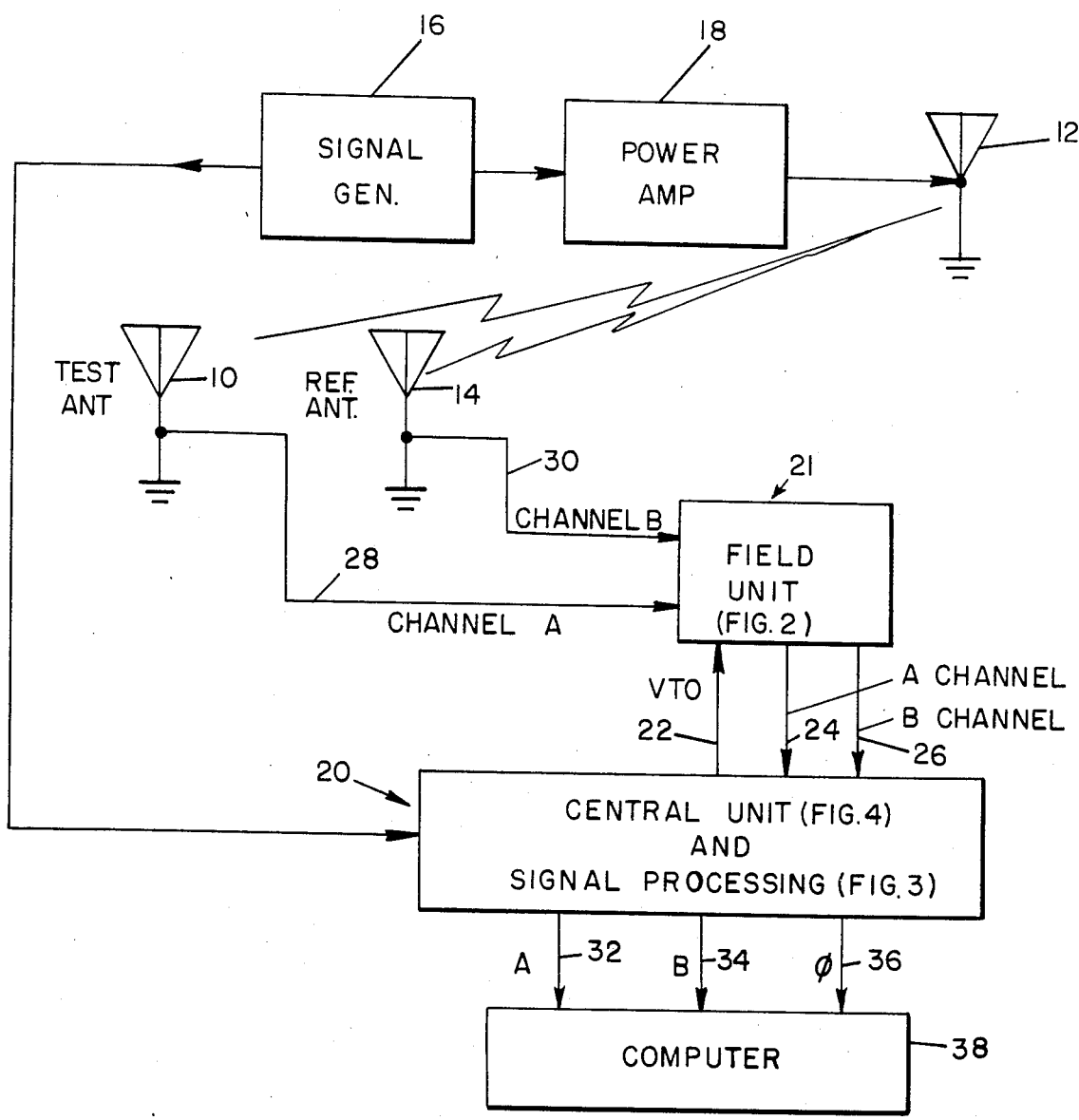
FIG. 1 is a schematic diagram of the basic system constituting the present invention.

Referring to the figures and more particularly FIG. 1 thereof, a test antenna 10 is schematically illustrated as receiving transmitted signals from an antenna 12 which is positioned at a predetermined distance from the test antenna 10. In the vicinity of the test antenna 10 is a reference antenna 14 also receiving r.f. signals from the transmitting antenna 12. The output signal from the test antenna 10 will be referred to throughout as being associated with channel A while the reference antenna will be considered as having an output associated with channel B. The conventional r.f. signal generator 16 provides an input to a power amplifier 18, which in turns drives the transmitting antenna 12.

The circuitry of the present invention is primarily contained within the central unit and signal processing block generally referred to by reference numeral 20 and the field unit 21. The latter-mentioned unit interfaces between the antennas 10, 14 and the central unit-signal processing block 20. The circuitry contained within blocks 20 and 21 is patterned after that included in a conventional vector voltmeter. Specifically, it has been found that the Hewlett Packard 8405A vector voltmeter provides the circuitry required for the inventive network analyzer. Accordingly, the present network analyzer will be described in terms of block diagrams, it being understood that the circuitry contained in 20, 21 is patterned after the mentioned vector voltmeter. In essence, each channel uses circuitry from a separate Hewlett Packard 8405A vector voltmeter with few changes in connections for each channel.

The signal generator 16 also provides a signal to an input of the central unit-signal processing block 21. The circuitry contained within this block is described in greater detail in FIGS. 4 and 3, respectively. As shown in FIG. 1, the central unit-signal processing block 20 provides a stabilized rate sampling signal indicated as VTO line 22. Data from the tested antenna 10 undergoes pre-processing by the field unit 21, shown in FIG. 2, and the data therefrom is present on the A channel line 24. Similarly, data from the reference antenna 14 becomes manifest at B channel line 26. Both the A channel and B channel lines provide inputs to the central unit-signal processing block 20. The resultant output from the central unit-signal processing block 20 appears as indicated. Namely, amplitude of the A channel or test antenna is present along line 32 while that regarding channel B or the reference antenna 14 is present along line 34. Phase relationship data between the channels is present at line 36, all lines 32, 34 and 36 providing inputs to a computer 38 for network analysis calculations. The computer 38 may be of any suitable type including a Hewlett Packard HP 9820A calculator. Particular data processing by the computer is not a part of the present invention, per se. Network analysis computations depend upon the results desired by the programmer.

Figure 2:
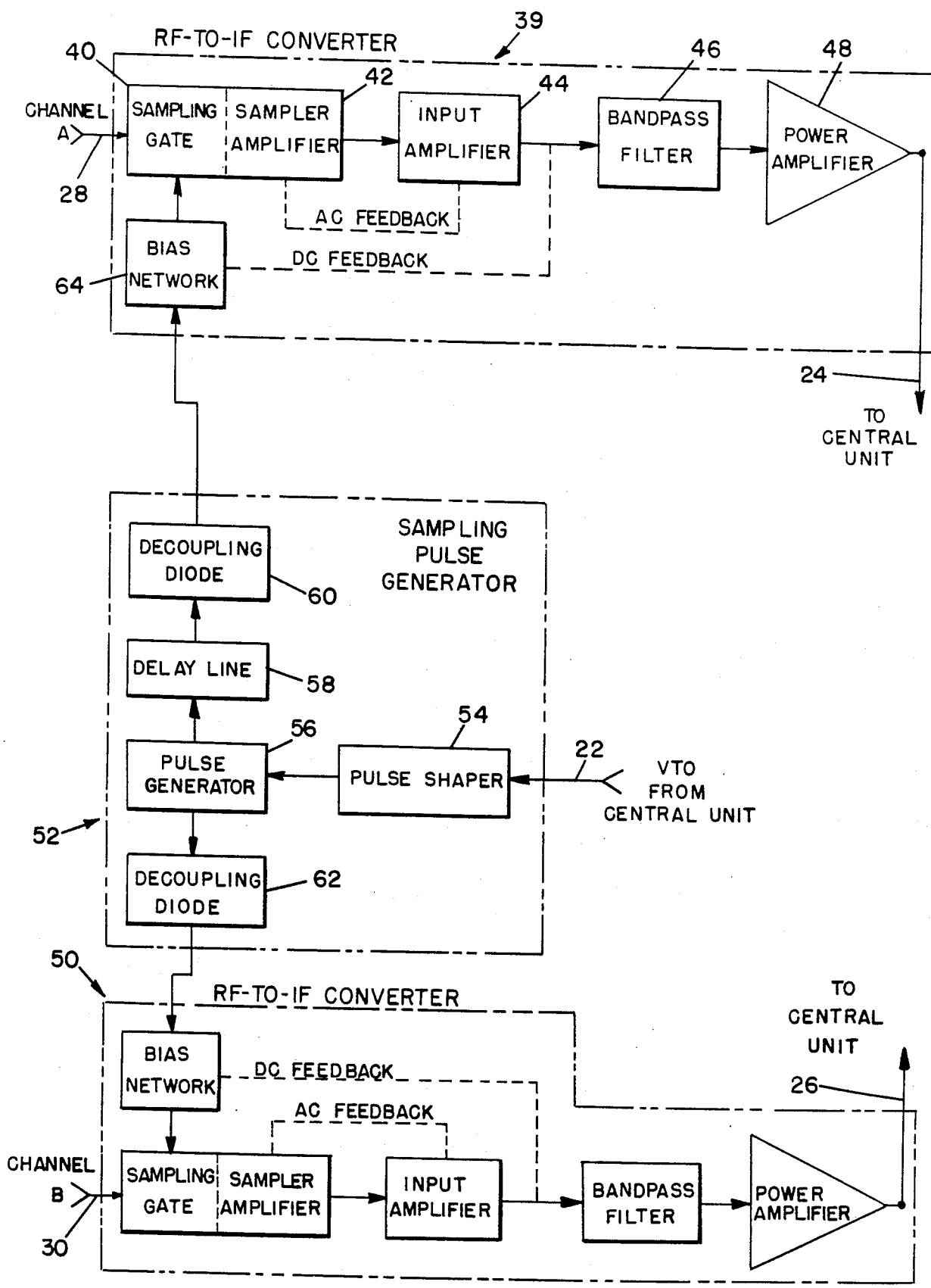
FIG. 2 is a block diagram of a field unit used in conjunction with the present invention.

The field unit previously indicated by reference numeral 21 in FIG. 1 is shown in greater detail in FIG. 2. The antenna signal from the tested antenna is fed along line 28 to an R.F.-I.F. converter 39 such as is employed in the previously mentioned vector voltmeter. The sampling gate 40 operates upon the signal from the tested antenna and the sampled signal is fed to an amplifier 42. Thereafter, an input amplifier 44 operates upon the signal by preparing it for filtering by a bandpass filter 46. A power amplifier 48 is connected to the output of the bandpass filter 46 and the output from power amplifier 48 constitutes a signal along line 24 which is illustrated in FIG. 1. It is this signal which may be fed over relatively long transmission lines, for example 800 feet, to the central unit-signal processing block 20. The output along line 24 will be an intermediate frequency signal, typically 20 kHz and corresponds to a time sampled signal of channel A relating to the tested antenna.

The sampling accomplished at the sampling gate 40 is driven by a bias network 64. The bias network 64 is fed by a sampling pulse generator 52 which is also of the type included in the vector voltmeter previously mentioned. The sampling pulse generator has an input at 22 carrying the voltage controlled or voltage tuned oscillator signal from the central unit (FIG. 1). Typically, the frequency of this signal will be 0.98–2 MHz. The signal along line 22 controls the sampling rate and is established at a fundamental frequency, not harmonics. The input along line 22 is fed to a pulse shaper 54 which clips the signal to simulate a squarewave. Unlike the previously mentioned vector voltmeter, the pulse shaper is an added conventional network, although the remaining illustrated blocks for the sampling pulse generator 52 are contained within the mentioned vector voltmeter. The output from the pulse shaper 54 drives a pulse generator 56 having dual outputs. The first output goes into a delay line 58 which drives the decoupling diode 60, as the sampling pulses are generated at the output of the decoupling diode 60, the bias network 64 is driven to permit the frequency conversion accomplished by the converter 39. The illustrated AC feedback exists between the sampler amplifier 42 and the input amplifier 44 while a D.C. feedback path exists between the output of the input amplifier 44 and an input of the bias network 64. A second output from the pulse generator 56 drives a second decoupling diode 62, identical to the first decoupling diode 60. The output of the decoupling diode 62 drives the input of a second R.F.-I.F. converter 50, identical to the first-mentioned converter 39. The converter 50 is completely dedicated to channel B which corresponds to the reference antenna 14 (FIG. 1).

Figure 3:
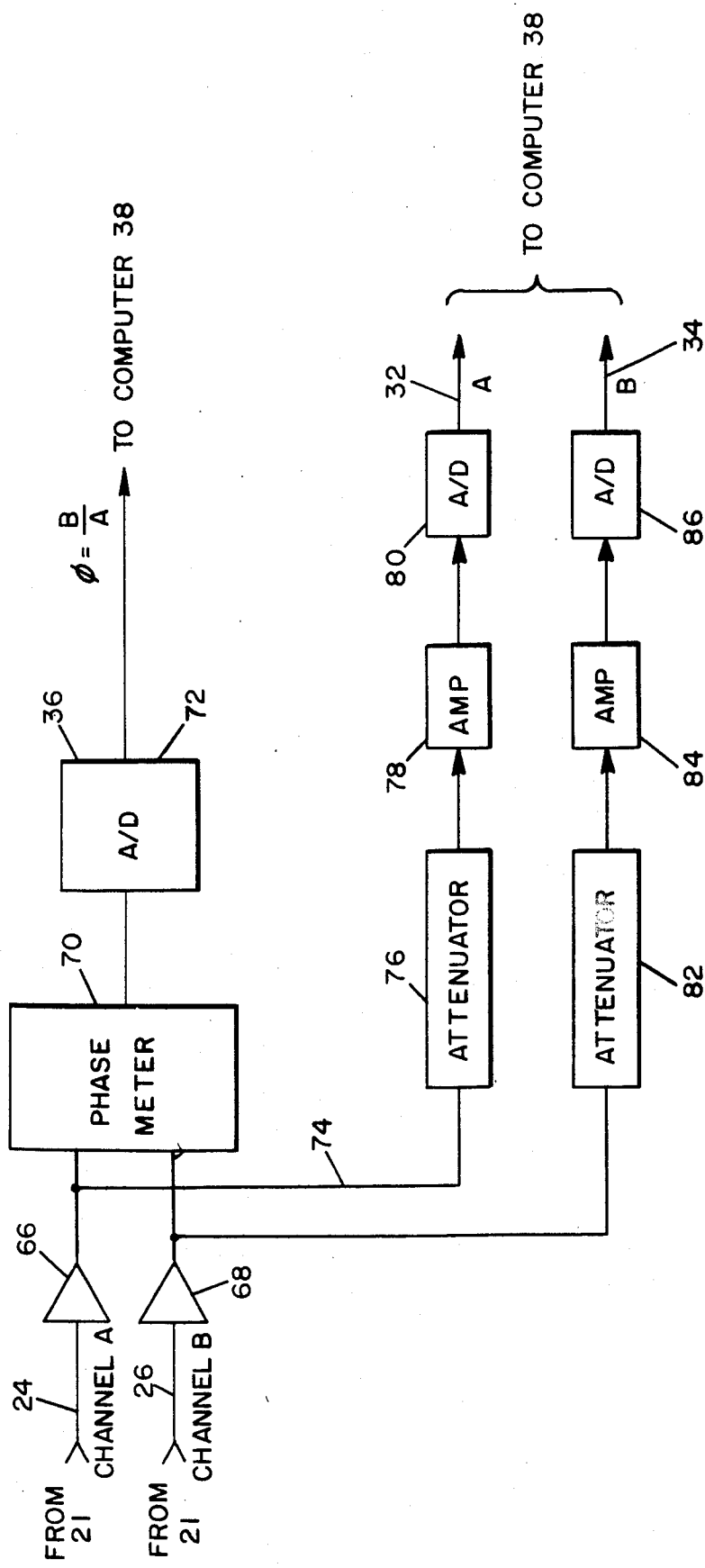
FIG. 3 is a block diagram of a signal processing network as utilized in the present invention.

FIG. 3 illustrates the signal processing portion of the block 20 (FIG. 1). Channel A and channel B signals from the field unit occur on lines 24 and 26, respectively. Unity gain amplifiers 66 and 68 respectively provide channel A and channel B signals to a dual input phase meter 70. This phase meter is of the type included in the aforementioned vector voltmeter. The output from the phase meter 70 drives the conventional A/D converter 72 thereby converting analog phase information to digital phase information. This digital information may then provide an input to the computer 38 for pre-programmed network analysis. However, in order to complete such network analysis of the tested antenna, it is necessary to provide the computer 38 with digital data regarding the amplitude of the signals derived from channel A and channel B. Information with respect to the amplitude of channel A is derived from the output of unity gain amplifier 66 through the indicated signal attenuator 76, amplifier 78 and A/D converter 80. Likewise, a digital amplitude signal for channel B is derived from the output of the unity gain amplifier 68. That output is then provided to the serially connected components attentuator 82, amplifier 84 and A/D converter 86.

Figure 4:
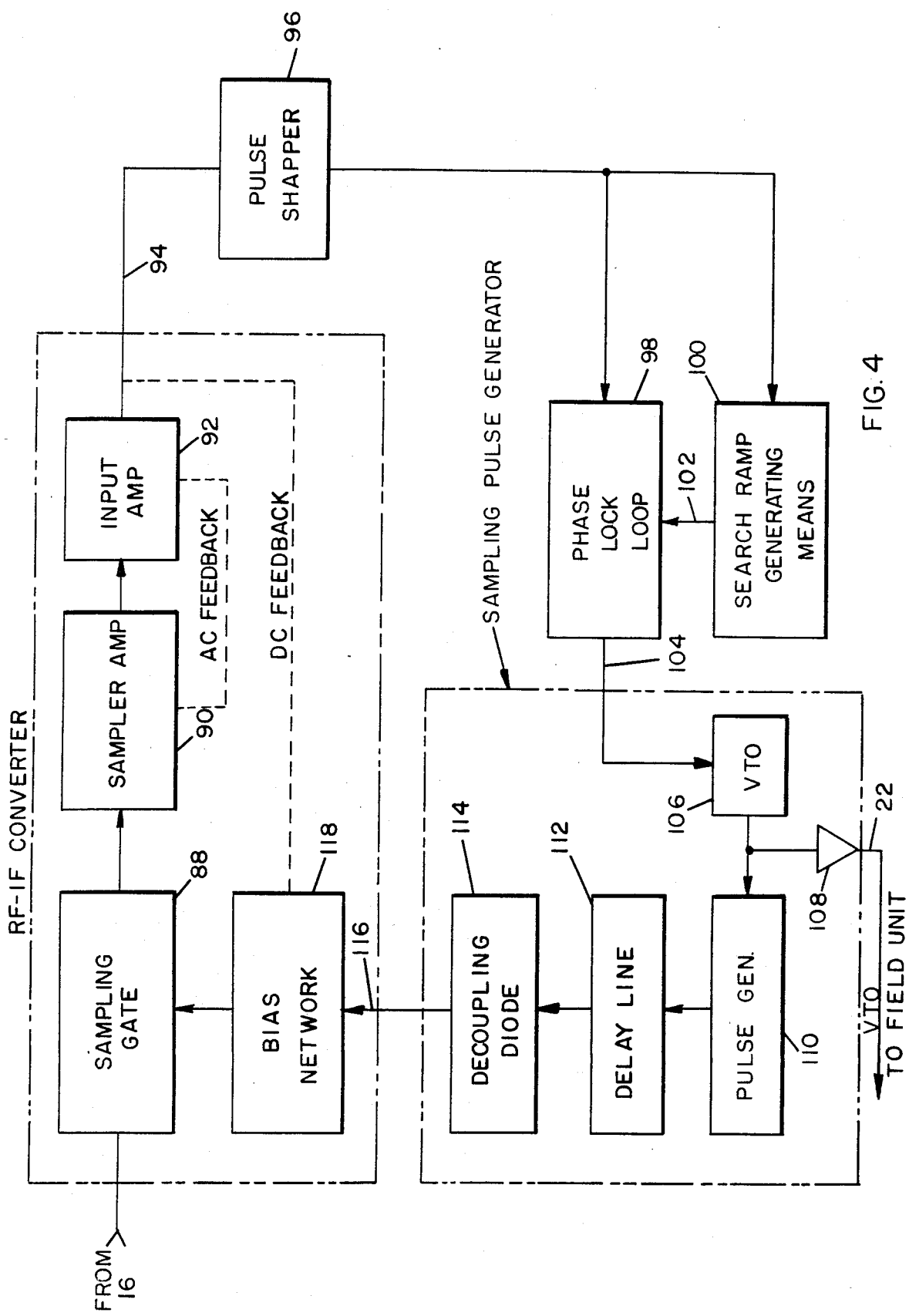
FIG. 4 is a central unit which cooperates between the field unit and signal processing network of the present invention.

The central unit included in block 1 (FIG. 1) is more particularly shown in FIG. 4. The function of the central unit is to furnish the field unit 21 with a VTO signal which controls the sampling rate in the field unit. The upper illustrative portion of the circuitry includes a R.F.-I.F. converter. The input to the converter comes from the signal generator 16 providing a stable frequency input. As in the case of converter 39 (FIG. 2), the components within the converter are identical with those of the previously identified vector voltmeter. First, a sampling gate 88 samples the input coming from the signal generator 16. A sampler amplifier 90 amplifies this signal from the gate and feeds it to an input amplifier 92. The sampling of the input causes the frequency conversion. The sampling is effected by the bias network 118 driven by a sampling pulse generator, as indicated. This generator includes components identical with those previously identified in connection with the sampling pulse generator 52 (FIG. 2). The sampling rate of gate 88 depends upon the frequency converted signal on line 94 which undergoes pulse shaping at shaper 96 which clips the signal fed thereto and subsequently, a low pass filter operates upon the signal to simulate a square wave. The output from the shaper 96 feeds a phase lock loop 98 having the primary purpose of regulating the sampling rate to the converter. The phase lock loop is identical with that described in connection with the previously mentioned vector voltmeter. The output from pulse shaper 96 also branches to the input of a search ramp generating means 100. A ramp generator of this type is included in the previously mentioned vector voltmeter. The output 102 from the search ramp generating means 100 serves as a second input to the phase lock loop 98.

The output from the phase lock loop is fed along line 104 to a voltage controlled or tuned oscillator (VTO) 106. The output from the VTO 106 first branches to amplifier 108 that furnishes the VTO signal to the field unit along output line 22. The second branch of the VTO 106 output is to a pulse generator 110 which serially drives a delay line 112 and decoupling diode 114. The sampling signal occurs along the output of the decoupling diode 114 and forms the input 116 to the bias network 118. The bias network 118 triggers the sampling gate 88 to achieve the desired frequency conversion.

Thus described, the present invention is seen to comprise a network analyzer for an r.f. antenna undergoing testing. It should be emphasized that although the invention includes circuitry of the aforementioned vector voltmeter, the present invention does not function as a vector voltmeter. Rather, its purpose is to permit network analysis of an antenna undergoing testing.

I wish it to be understood that I do not desire to be limited to the exact details of construction shown and described, for obvious modifications can be made by a person skilled in the art.

I claim the following:

1. A dual channel network analyzer for testing an antenna in comparison with a reference antenna, the analyzer comprising:

first sampling means associated with each channel for respectively sampling, at a preselected rate, either first or second r.f. signals from the tested antenna and reference antenna resulting in the conversion of said signals to intermediate frequency;

signal generating means having a first output connected in circuit with a transmission antenna which transmits signals to the tested antenna and reference antenna simultaneously;

second sampling means for sampling, at the preselected rate, a second output of the signal generating means;

phase lock loop means having an input connected to the output of the second sampling means;

voltage tuned oscillating means connected to the output of the phase lock loop means for generating a signal which establishes the preselected rate;

phase metering means having inputs respectively connected to the first and second converted signals for producing a phase measurement of the first signal relative to the second;

first analog-digital conventing means for converting the phase measurement to a digital signal;

second and third analog-digital converting means for converting the first and second signals to digital signals representing the respective amplitudes of the signals derived from the test and reference antennas; and means respectively connected to the outputs of the analog-digital converting means for allowing connection of the digital phase and amplitude signals to a computer.

2. The subject matter set forth in claim 1 wherein the first sampling means has individual channels, each comprising:

a sampling gate having an input responsive to a radio frequency signal from an associated antenna and enabled by a sampling pulse generator operating at the preselected sampling rate;

amplifier means connected to the output of the sampling gate for amplifying the output of the gate; and filter means responsive to the amplifier means output for passing a preselected frequency band therethrough.

3. The subject matter set forth in claim 1 wherein the second sampling means comprises:

a sampling gate having an input responsive to the second output of the signal generating means and enabled by a sampling pulse generator operating at the preselected sampling rate; and amplifier means connected to the output of the sampling gate for amplifying the output of the gate.

4. The subject matter set forth in claim 1 wherein each of the second and third analog-digital converting means comprises:

means for attenuating the respective first and second signals from the antennas;

means connected to the attenuating means for amplifying the output of the attenuating means to a predetermined voltage; and an analog-digital converter connected to the output of the amplifying means for converting analog values to digital values.

5. The subject matter set forth in claim 2 wherein the sampling pulse generator comprises:

means connected to the output of the voltage tuned oscillating means for shaping pulses derived from the voltage tuned oscillating means;

a pulse generator triggered by the output of the pulse shaper;

a delay line connected to the output of the pulse generator; and means for decoupling the output of the delay line from an input of the first sampling means.

6. The subject matter set forth in claim 5 wherein the decoupling means is a diode.

7. The subject matter set forth in claim 6 wherein the input of the first sampling means includes a bias network connected between the diode and the sampling gate.

8. The subject matter set forth in claim 7 wherein the second sampling means comprises:

a sampling gate having an input responsive to the second output of the signal generating means and enabled by a sampling pulse generator operating at the preselected sampling rate; and amplifier means connected to the output of the sampling gate for amplifying the output of the gate.

9. The subject matter set forth in claim 8 wherein each of the second and third analog-digital converting means comprises:

means for attenuating the respective first and second signals from the antennas;

means connected to the attenuating means for amplifying the output of the attenuating means to a predetermined voltage; and an analog-digital converter connected to the output of the amplifying means for converting analog values to digital values.

10. The subject matter set forth in claim 9 together with unity gain means connected to the inputs of the phase meter for amplifying the first and second converted signals prior to their introduction to the phase meter.

* * * * *